United States Patent
Peumans et al.

(10) Patent No.: US 7,597,927 B2
(45) Date of Patent: Oct. 6, 2009

(54) SOLAR CELLS

(75) Inventors: Peter Peumans, Palo Alto, CA (US); Soichi Uchida, Yokohama (JP); Stephen R. Forrest, Princeton, NJ (US)

(73) Assignee: The Trustees of Princeton Univeristy, Princeton, NJ (US)

( * ) Notice: Subject to any disclaimer, the term of this patent is extended or adjusted under 35 U.S.C. 154(b) by 1036 days.

(21) Appl. No.: 10/876,951

(22) Filed: Jun. 24, 2004

(65) Prior Publication Data

US 2005/0061364 A1 Mar. 24, 2005

(51) Int. Cl.
*B05D 5/12* (2006.01)
(52) U.S. Cl. .......................... 427/74; 427/77; 427/98.3; 427/98.9; 427/99.4
(58) Field of Classification Search .................. 427/74, 427/77, 98.3, 98.9, 99.4
See application file for complete search history.

(56) References Cited

U.S. PATENT DOCUMENTS

| | | | |
|---|---|---|---|
| 5,703,436 A | 12/1997 | Forrest et al. | |
| 6,097,147 A | 8/2000 | Baldo et al. | |
| 6,198,091 B1 | 3/2001 | Forrest et al. | |
| 6,278,055 B1 * | 8/2001 | Forrest et al. | 136/263 |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,451,415 B1 | 9/2002 | Forrest et al. | |
| 6,469,437 B1 | 10/2002 | Parthasarathy et al. | |
| 6,580,027 B2 | 6/2003 | Forrest et al. | |
| 6,657,378 B2 | 12/2003 | Forrest et al. | |
| 6,670,213 B2 | 12/2003 | Halls et al. | |
| 2001/0011551 A1 | 8/2001 | Peumans et al. | |
| 2002/0108649 A1 * | 8/2002 | Fujimori et al. | 136/263 |
| 2003/0066950 A1 | 4/2003 | Halls et al. | |
| 2003/0226498 A1 * | 12/2003 | Alivisatos et al. | 117/84 |

OTHER PUBLICATIONS

<http://www.oksolar.com/solar_panels/unisolar_flexibles.htm>, "Uni-solar Flexible (USF) Unbreakable Solar Panels—Triple Junction", printed Sep. 14, 2004.
"UNI-POWER Solar Electric Modules Specification Sheet, Models US-64, US-42, US-32", printed from the OKSolar.com website on Sep. 14, 2004 <http://www.oksolar.com/pdf/solar_energy_catalog/unisolar_us-64.pdf>.
"Amorphous Silicon (a-Si) Solar Technology", printed from United Solar Ovonic Corp. website on Sep. 14, 2004, <http://www.uni-solar.com/Our_Technology_a_Si.html>.
S. Guha, et al., "Amorphous Silicon Alloy Photovoltaic Research Present and Future", Progress in Photovoltaics: Research and Applications, Prog. Photovolt. Res. Appl. 8, pp. 141-150 (2000).

(Continued)

*Primary Examiner*—Binh X Tran
(74) *Attorney, Agent, or Firm*—Duane Morris LLP

(57) ABSTRACT

Organic photosensitive optoelectronic devices are disclosed. The devises are thin-film crystalline organic optoelectronic devices capable of generating a voltage when exposed to light, and prepared by a method including the steps of: depositing a first organic layer over a first electrode; depositing a second organic layer over the first organic layer; depositing a confining layer over the second organic layer to form a stack; annealing the stack; and finally depositing a second electrode over the second organic layer.

20 Claims, 6 Drawing Sheets

OTHER PUBLICATIONS

Tang, "Two-Layer Organic Photovoltaic Cell," Applied Physics Letter, vol. 48, pp. 183-185 (1986).

Peumans et al, "Efficient Photon Harvesting at High Optical Intensities in Ultrathin Organic Double-Heterostructure Photovoltaic Diodes," Applied Physics Letter, vol. 76, No. 19, pp. 2650-2652 (May 8, 2000).

Geens et al., "Organic co-evaporated films of a PPV-pentamer and C60: model systems for donor/acceptor polymer blends," Thin Solid Films, vols. 403-404, pp. 438-443 (2002).

Tsuzuki et al., "The effect of fullerene doping on photoelectric conversion using titanyl phthalocyanine and a perylene pigment", Sol. Energy Material, vol. 61, pp. 1-8 (2000).

W.T. Welford and R. Winston, *High Collection Nonimaging Optics*, pp. 172-179, Academic Press, 1989.

Forrest et al., "Multilayer Organic Photodetectors with Improved Performance," U.S. Appl. No. 10/723,953, filed Nov. 26, 2003.

Peumans et al., "Aperiodic Dielectric Multilayer Stack," U.S. Appl. No. 10/857,747, filed Jun. 1, 2004.

* cited by examiner

SOLAR CELLS

FIELD OF INVENTION

The present invention generally relates to organic photosensitive optoelectronic devices. More specifically, it is directed to thin-film crystalline organic photovoltaic devices, e.g., organic solar cells prepared by annealing.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, ff.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~106 V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, some organic PV devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency g associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50$ Å) than the optical absorption length (~500 Å), requiring a trade off between using a thick, and therefore resistive, cell with multiple or highly folded interfaces, or a thin cell with a low optical absorption efficiency. To date none of these proposals has led to a significant improvement in overall cell performance, particularly at high illumination intensities. In order to increase the cell performance, materials and device configurations are desirable which can enhance the quantum yield and, therefore, the power conversion efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

Through the use of an organometallic material in the photoactive region, the devices of the present invention may efficiently utilize triplet excitons. We have found that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

According to the present invention, improved device processing techniques allow for the construction of organic PV cells with improved power conversion efficiencies compared to conventionally prepared devices.

SUMMARY AND OBJECTS OF INVENTION

The present invention provides a method for the preparation of organic-based solar cells with improved power conversion efficiency. These PV devices comprise an anode layer, a first organic layer (organic hole transporting (donor-type) layer), a second organic layer (electron transporting (acceptor-type) layer), and a cathode. Advantageously, the device also includes one or more exciton blocking layers (EBL) between the ETL and the cathode and/or between the anode and the HTL.

The method for making the organic photosensitive optoelectronic devices comprises the steps of:
(a) depositing a first organic layer over a first electrode;
(b) depositing a second organic layer over the first organic layer;
(c) depositing a confining layer over the second organic layer to form a stack,
(d) annealing the stack; and
(e) depositing a second electrode over the second organic layer, wherein the device is capable of generating a voltage when exposed to light.

It is an object of the present invention to provide an organic PV device with improved photovoltaic performance. To this end, the invention provides an organic PV device capable of operating with a high external quantum efficiency.

Another object of the present invention is to provide a method for the fabrication of a bulk heterojunction using small molecular weight materials.

BRIEF DESCRIPTION OF THE DRAWINGS

The foregoing and other features of the present invention will be more readily apparent from the following detailed description of exemplary embodiments taken in conjunction with the attached drawings.

FIG. 5(a) shows room-temperature power conversion efficiency, $\eta_P$, open-circuit voltage, $V_{OC}$, and fill factor, FF, as functions of the second annealing temperature, $T_{A2}$, for the layer structure: ITO/150 Å CuPc/440 Å CuPc:PTCBI (1:1)/100 Å PTCBI/150 Å BCP/1000 Å Ag, where the BCP/Ag layers were deposited after the first anneal (at $T_{A1}=520K$). FIG. 5(b) shows room-temperature $\eta_P$, $V_{OC}$, and FF, as functions of the incident optical power intensity, $P_{inc}$, after the second annealing process at $T_{A2}=460K$ for the same layer structure as in FIG. 5a. FIG. 5(c) shows room-temperature current density-voltage characteristic of the device of FIG. 5b at various incident power levels. FIG. 5(d) shows external quantum efficiency, $\eta_{EQE}$, of the mixed-layer device of FIG. 5b, measured with (open squares) and without (closed squares) flooding by 105 mW/cm$^2$ AM1 illumination. For comparison, the $\eta_{EQE}$ of an optimized ITO/200 Å CuPc/200 Å PTCBI/150 Å BCP/Ag bilayer structure is also shown (open circles).

DETAILED DESCRIPTION

An organic photosensitive optoelectronic device is provided. Organic devices of embodiments of the present invention may be used, for example, to generate a usable electrical current from incident electromagnetic radiation (e.g., PV devices) or may be used to detect incident electromagnetic radiation. Embodiments of the present invention may comprise an anode, a cathode, and a photoactive region between the anode and the cathode. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Figure 6:
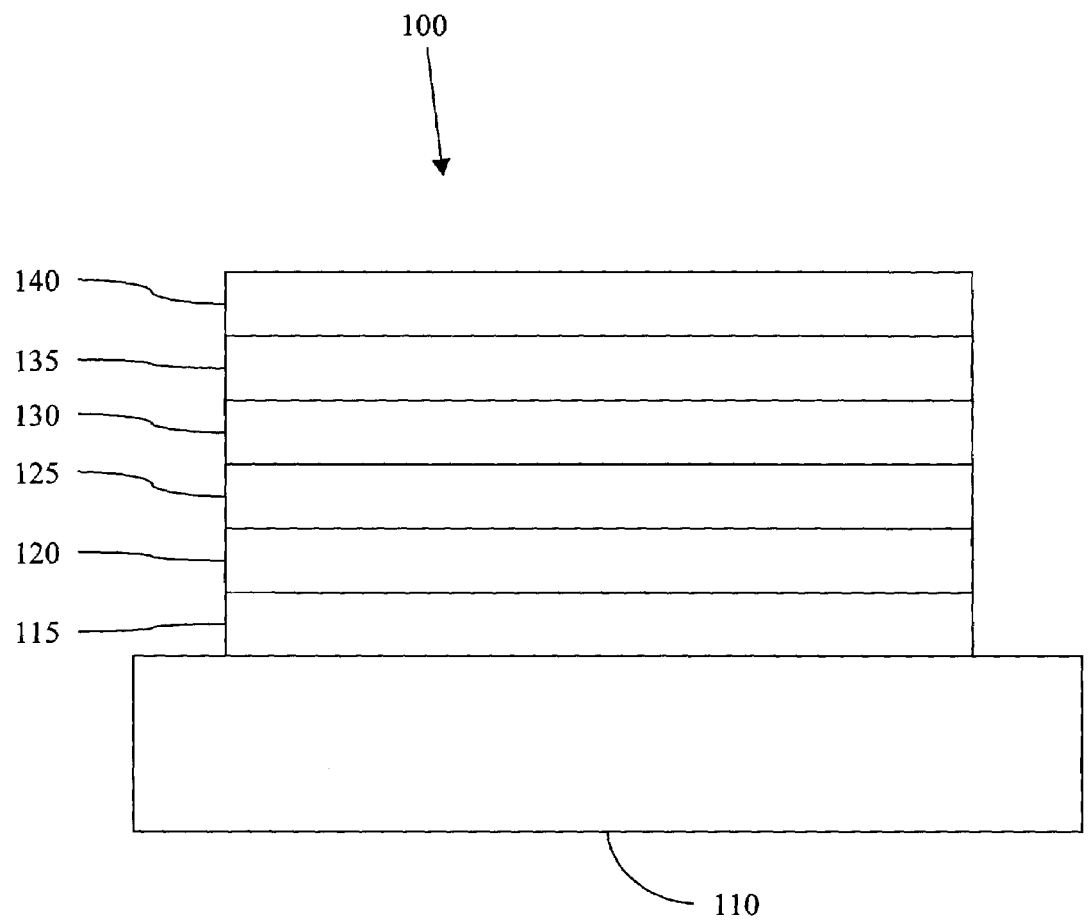
FIG. 6 shows an organic PV device comprising an anode, an anode smoothing layer, a donor layer, an acceptor layer, a blocking layer, and a cathode.

FIG. 6 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The specific arrangement of layers illustrated in FIG. 6 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used.

The simple layered structure illustrated in FIG. 6 is provided by way of non-limiting example, and it is understood that embodiments of the invention may be used in connection with a wide variety of other structures. The specific materials and structures described are exemplary in nature, and other materials and structures maybe used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Organic layers may be fabricated using vacuum deposition, spin coating, organic vapor-phase deposition, inkjet printing and other methods known in the art.

Organic photosensitive optoelectronic devices of embodiments of the present invention may function as a PV, photodetector or photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

The substrate may be any suitable substrate that provides desired structural properties. The substrate may be flexible or rigid, planar or non-planar. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

An organic photosensitive device will comprise at least one photoactive region in which light is absorbed to form an excited state, or "exciton", which may subsequently dissociate in to an electron and a hole. The dissociation of the exciton will typically occur at the heterojunction formed by the juxtaposition of an acceptor layer and a donor layer. For example, in the device of FIG. 6, the "photoactive region" may include donor layer 125 and acceptor layer 130.

Examples of acceptor materials include, for example, perylenes, naphthalenes, fullerenes or nanotubes. An example of an acceptor material is 3,4,9,10-perylenetetracarboxylic bis-benzimidazole (PTCBI). Alternatively, the acceptor layer may be comprised of a fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material for the donor layer may be a pthalocyanine or a porphyrin, or a derivative or transition metal complex thereof, such as copper pthalocyanine (CuPc). Other suitable acceptor and donor materials may be used.

The power conversion efficiency, $\eta_P$, of both small molecular weight and polymer organic photovoltaic (PV) cells has increased steadily in the last decade. This progress may be, to a great extent, attributed to the introduction of the donor-acceptor (DA) heterojunction which functions as a dissociation site for the strongly bound photogenerated excitons. Further progress was realized in polymer devices through use of blends of the donor and acceptor materials. Phase separation during spin-coating leads to a bulk heterojunction which removes the exciton diffusion bottleneck by creating an interpenetrating network of the donor and acceptor materials. The realization of bulk heterojunctions using mixtures of vacuum-deposited small molecular weight materials has been elusive since phase separation, induced by elevating the substrate temperature, leads to a significant roughening of the film surface and short-circuited devices.

In one embodiment of the present invention a PV cell is prepared by use of a metal cap to confine the organic materials during annealing. Without wishing to be bound by theory, it is believed that the metal cap confining layer acts to prevent the formation of a rough surface morphology while allowing an interpenetrating DA network to form. It has now been discovered that this method results in a power conversion efficiency that is 50% higher than the best values reported for comparable bilayer devices. It is believed that the strained annealing process for the formation of bulk heterojunctions has both fundamental and practical implications, including the preparation of low-cost and high-efficiency thin film organic solar cells based on vacuum-deposited small molecular weight organic materials.

PV devices produce a photogenerated voltage when they are connected across a load and are irradiated by light. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have values, $I_{max}$ and $V_{max}$, respectively.

A figure of merit for solar cells is the fill factor, ff defined as:

$$ff = \frac{I_{max} V_{max}}{I_{SC} V_{OC}} \qquad (1)$$

where ff is always less than 1, as $I_{SC}$ and $V_{OC}$ are never obtained simultaneously in actual use. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0+h\nu \Rightarrow S_0^*$. Here $S_0$ and $S_0^*$ denote ground and excited molecular states, respectively. This energy absorption is associated with the promotion of an electron from a bound state in the HOMO, which may be a $\pi$-bond, to the LUMO, which may be a $\pi^*$-bond, or equivalently, the promotion of a hole from the LUMO to the HOMO. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair must become separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photogenerated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Due to these unique electronic properties of organic materials, rather than designating them as "p-type" or "acceptor-type" and "n-type" or "donor-type", the nomenclature of "hole-transporting-layer" (HTL) or "electron-transporting-layer" (ETL) is frequently used. In this designation scheme, an ETL will be preferentially electron conducting and an HTL will be preferentially hole transporting.

A typical prior art photovoltaic device configuration is the organic bilayer cell. In the bilayer cell, charge separation predominantly occurs at the organic heterojunction. The built-in potential is determined by the HOMO-LUMO energy difference between the two materials contacting to form the heterojunction. The HOMO-LUMO gap offset between the HTL and ETL produce an electric field around the HTL/ETL interface.

Figure 1F:
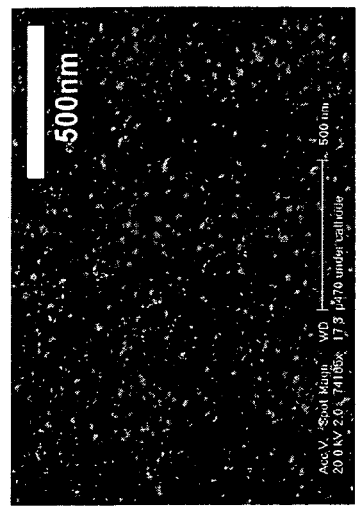
FIG. 1 shows schematic diagrams of various types of organic donor-acceptor organic photovoltaic cells: (a) a bilayer cell; (b) a bulk heterojunction cell; (c) a mixed-layer cell. The figure further contains scanning electron microscope images of the surface of a ~5000 Å-thick CuPc:PTCBI film on ITO. In 1(d) the film was annealed in the absence of a metal cap. White arrows indicate several pinholes.
FIG. 1(e) shows a cross-section of the same film obtained by cleaving the substrate. In 1(f) the film was capped by a 1000 Å-thick film of Ag which was removed prior to imaging. For comparison, in 1(g), the organic surface of a non-annealed ITO/400 Å CuPc/400 Å PTCBI/1000 Å Ag is shown after removal of the Ag cap. The white bar in all images represents 500 nm.
Figure 1G:
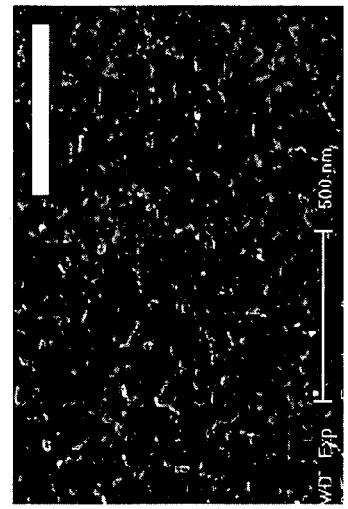

The external quantum efficiency of a PV cell based on exciton dissociation at a DA interface is $\eta_{EQE}=\eta_A \cdot \eta_{ED} \cdot \eta_{CC}$. Here, $\eta_A$ is the absorption efficiency. The diffusion efficiency, $\eta_{ED}$, is the fraction of photogenerated excitons that reaches a DA interface before recombining. The carrier collection efficiency, $\eta_{CC}$, is the probability that a free carrier, generated at a DA interface by dissociation of an exciton, reaches its corresponding electrode. Typically, in bilayer DA PV cells with a total thickness, L, on the order of the optical absorption length, $L_A$, we have $\eta_A=1-\exp(-L=L_A)>50\%$ if optical interference effects are ignored, and $\eta_{CC}=100\%$. However, since the exciton diffusion length ($L_D$) in organic materials is typically an order of magnitude smaller than $L_A$, a large fraction of the photogenerated excitons remains unused for photocurrent generation (FIG. 1a). This provides a significant limit to $\eta_{EQE}$ and hence $\eta_p$ of this type of planar junction cell.

Figure 1D:
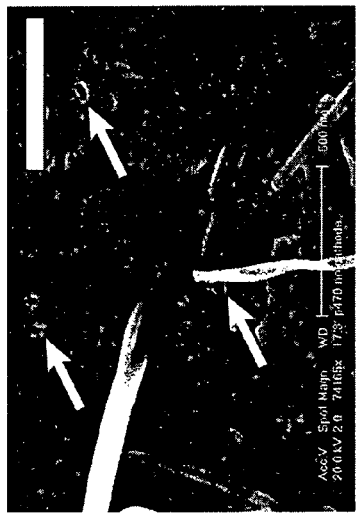
Figure 1E:
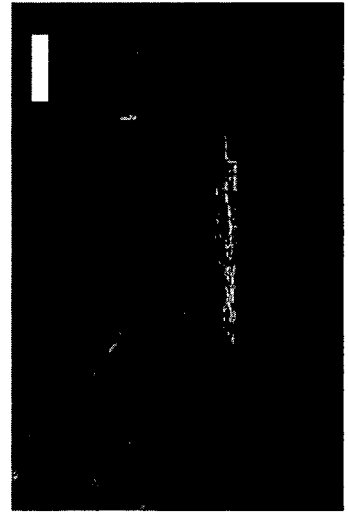
Figure 1A:
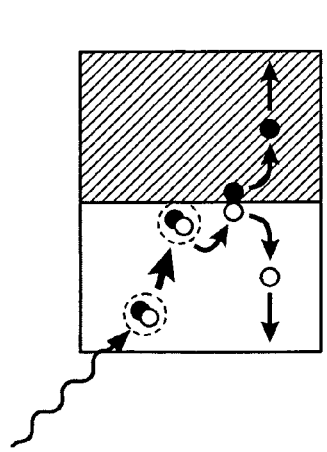
Figure 1B:
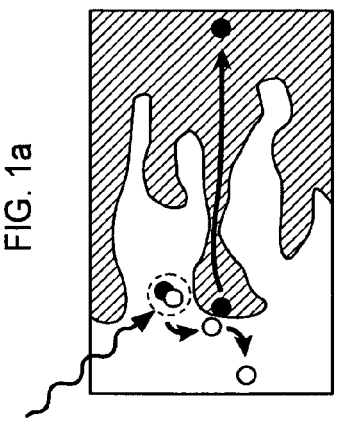

In polymer PV cells, the exciton diffusion bottleneck has been removed through the introduction of bulk heterojunctions (FIG. 1b). In a bulk heterojunction, the DA interface is highly folded such that photogenerated excitons always find a DA interface within a distance $L_D$ of their generation site. Currently, state-of-the-art bulk heterojunction polymer PV cells have power conversion efficiencies of up to 3.5%. The bulk heterojunction is typically fabricated by spin-coating a mixture of soluble versions of the donor and acceptor materials. During spin coating and solvent evaporation, the donor and acceptor materials phase separate, creating an intricate interpenetrating network. The morphology of the resulting structure is controlled by changing the spin conditions, solvents and relative material concentrations. The challenge of such systems is to balance a high $\eta_{ED}$, favoring finely grained morphologies, and a high $\eta_{CC}$ favoring coarse granularity, such that the product $\eta_{ED} \cdot \eta_{CC}$ is maximized.

Figure 1C:
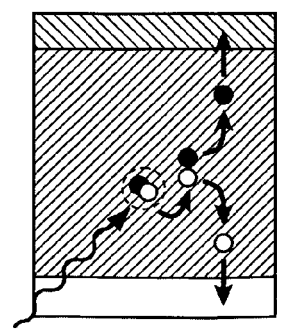

Realizations of bulk-type heterojunctions in small molecular systems have been largely unsuccessful. Attempts to achieve a bulk heterojunction through co-deposition of the donor and acceptor materials yield devices with power conversion efficiencies falling short of those achievable in optimized bilayer devices using the same materials. Strong quenching of the photoluminescence in mixed materials indicates that $\eta_{ED}$~100%. Therefore, the low efficiencies are attributed to poor charge transport, resulting in low carrier collection efficiencies, $\eta_{CC}$ (FIG. 1c). If charge collection is assisted by the application of an external voltage, high external quantum efficiencies can be obtained.

Growth of mixed layers at elevated substrate temperatures leads to phase separation and the appearance of crystalline domains. However, this increase in crystallinity and possibly larger $L_D$ comes at the cost of an increased film roughness. The high density of pinholes leading to short circuits between cathode and anode contacts in such structures makes device fabrication impractical. The same problem occurs when mixed-layer films are annealed post deposition to induce phase separation.

In one embodiment, the present invention relates to a method for the fabrication of bulk heterojunctions in small molecule systems based on annealing mixed-layer films in a confined geometry. In this case, the devices are completed with a suitable cathode, and then subsequently annealed. Suitable cathodes include metallic cathodes and typically have a thickness of about 1000 Å. The metal cathode stresses the organic film during annealing, preventing morphological relaxation and the concomitant formation of a high density of pinholes, while permitting phase separation to occur in the bulk of the organic film leading to the desired highly folded bulk heterojunction. In a preferred embodiment, annealing in a confined geometry reduces or prevents the formation of crystalline domains. For example, any crystalline domains formed during such annealing may be preferably limited in size to 0.5 nm to 100 nm, or preferably less than 0.5 nm.

The present invention provides organic PV devices with increased efficiency comprising an anode layer, a first organic layer (organic hole transporting (donor-type) layer), a second organic layer (electron transporting (acceptor-type) layer), and a cathode, and a process for the preparation of such devices. Alternatively, the first organic layer may be an acceptor-type layer, and the second organic layer a donor-type layer. Advantageously, the device also includes one or more exciton blocking layers (EBLs). Further, the device may also include a charge transfer layer.

The present invention provides devices incorporating at least a first and a second organic layer, that show substantially improved power conversion efficiencies over previously demonstrated organic thin-film PV cells. The devices are prepared by depositing the first organic layer over the anode; depositing the second organic layer over the first organic layer; depositing a confining layer over the second organic layer to form a stack; annealing the stack; and finally depositing a second electrode over the second organic layer. The annealing of the stack is carried out at a sufficient temperature and for a sufficient time so as to induce phase separation in the organic layers.

The confining layer may be damaged or destroyed during the annealing process, and the second electrode is deposited over the second organic layer following removal, if necessary, of the confining layer. The confining layer may be any suitable material capable of confining the organic layers during the annealing process. While the presence of the confining layer prevents the development of surface roughness, it does not prevent phase segregation within the bulk of the mixed organic layers. Preferred materials for use in the confining layer include silver metal (Ag) and BCP/Ag. A most preferred material for use in the confining layer is silver metal (Ag).

Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

The annealing process is carried out for a time and at a temperature suitable to bring about phase separation of the layers. In a preferred embodiment, the annealing is carried out at a temperature of from about 340K to about 600K. More preferably, the annealing is carried out at a temperature of about 560K. Preferably the time for the annealing process is from about 5 seconds to about 30 minutes. More preferably, the annealing process is for a time of from about 2 minutes to about 30 minutes.

The annealing process is typically performed under reduced pressure. The pressure used is preferably less than about 10 mTorr, preferably about 1 mTorr-10 mTorr, and more preferably 1 mTorr to $10^{-10}$ Torr. The annealing may be brought about in a functional atmosphere. Functional atmospheres are typically inert gas atmospheres, and include nitrogen and argon. It is preferable to anneal in a vacuum or under an inert gas to reduce the presence of oxidants that might otherwise react with organic materials at annealing temperatures. Relatively inexpensive vacuum techniques may be used to achieve a vacuum of 1 mTorr-10 mTorr, so this pressure range may be preferred for combining low cost with some reduction of oxidants. Better vacuums are more preferable from a pure performance perspective, but additional cost may be involved.

Figure 2A:
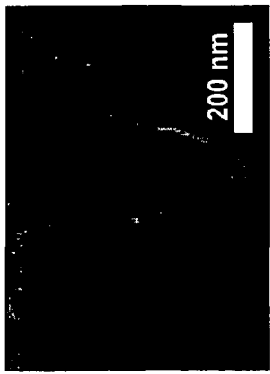
FIG. 2(a) was not annealed.
Figure 2B:
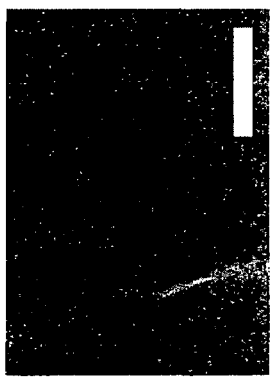
FIG. 2(b) was annealed for 15 min at 450K, (c) 500K, and (d) 550K. The lower figure shows the simulated effects of annealing on the interface morphology of a mixed layer PV cell. Here, the interface between CuPc and PTCBI is shown as a grey surface. CuPc is shown in black and PTCBI is left "transparent". The as-grown, or initial configuration is shown in (a). The configurations after annealing at (f) $T_{A1}=0.067\ E_{coh}/k$, (g) $T_{A1}=0.13\ E_{coh}/k$ and (h) $T_{A1}=0.20\ E_{coh}/k$ are also shown. Note the resemblance between the structure in the upper images and the simulated structures.
Figure 2C:
FIG. 2 shows scanning electron microscope images of cross-sections of a 5000 Å-thick CuPc:PTCBI(4:1) film on ITO.
Figure 2D:
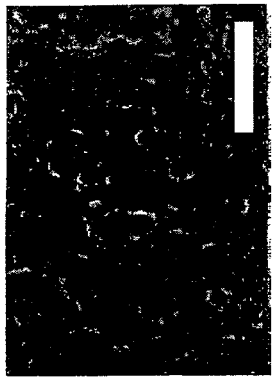
Figure 2E:
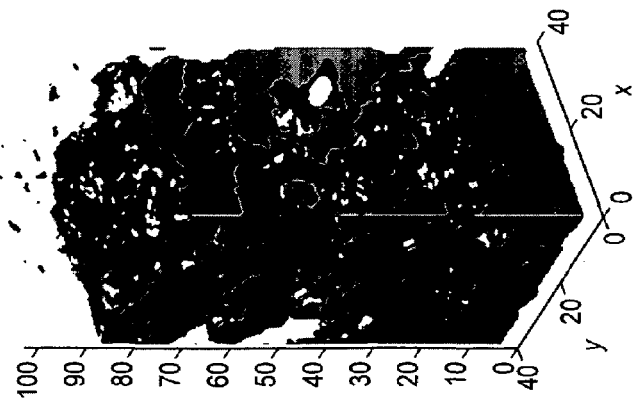
Figure 2F:
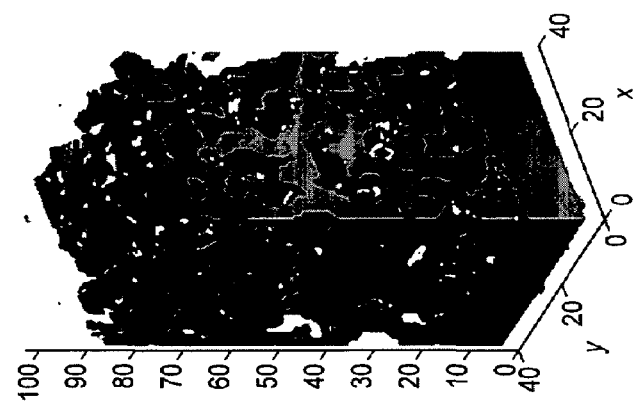
Figure 2G:
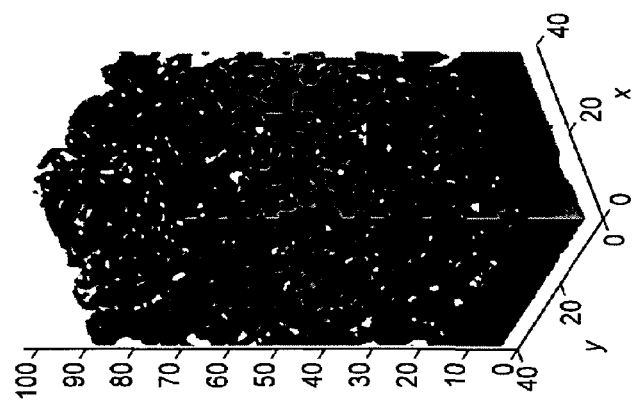
Figure 2H:
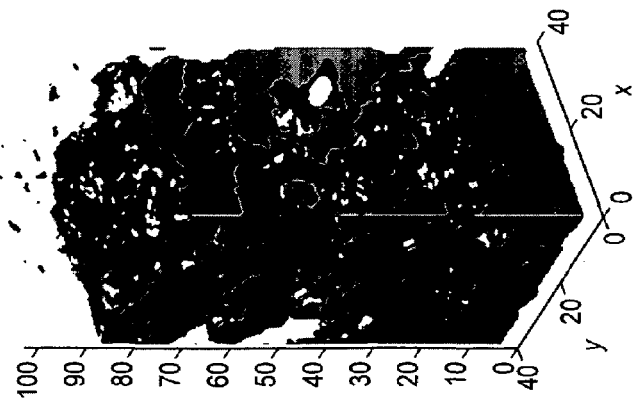

It has been discovered that, on annealing, phase separation takes place, leading to domains rich in the individual photoactive materials of the mixed layers, e.g. CuPc or PTCBI. Further, it has been discovered that the size of the domains increases with increasing annealing temperature. At 550K, domain sizes of about 20 nm may be found. Such phase segregation, leading to domains alternatively rich in CuPc and PTCBI, is demonstrated in FIG. 2a-d. Here, SEM images of cross-sections of the layer structure: ITO/5000 Å CuPc: PTCBI (4:1)/1000 Å Ag are shown for (a) an as-grown film, and for films annealed for 15 min at (b) $T_{A1}$=450K, (c) $T_{A1}$=500K, and (d) $T_{A1}$=550K. The cross-section of the as-grown film (FIG. 2a) does not exhibit any morphological features other than artifacts of the cleaving process.

The boundary of the organic layers forms a heterojunction which produces an internally generated electric field. A preferred material for the HTL is pthalocyanine, or a derivative or transition metal complex thereof. Copper pthalocyanine (CuPc) is a particularly preferred material for the HTL.

The electrodes, or contacts, used in a photosensitive optoelectronic device are an important consideration, as shown in U.S. Pat. No. 6,352,777, which is incorporated herein by reference. When used herein, the terms "electrode" and "contact" refer to layers that provide a medium for delivering photogenerated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer, where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent".

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. Pat. Nos. 6,469,437 and 6,420,031 to Parthasarathy et al. ("Parthasarathy"), or a highly efficient, low resistance metallic/non-metallic compound cathode such as disclosed in U.S. Pat. No. 5,703,436 to Forrest et al. ("Forrest '436"). Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode. Parasarathy discloses that an ITO layer onto which an organic layer had been deposited, instead of an organic layer onto which the ITO layer had been deposited, does not function as an efficient cathode.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photoconducting material, which is equivalent to electrons moving in the opposite manner. It will be noted that as the terms are used herein, anodes and cathodes may be electrodes or charge transfer layers.

In a preferred embodiment of the invention, the stacked organic layers include one or more exciton blocking layers (EBLs) as described in U.S. Pat. Nos. 6,097,147, and 6,451,415; and Peumans et al, *Applied Physics Letters* 2000, 76, 2650-52, incorporated herein by reference. Higher internal and external quantum efficiencies have been achieved by the inclusion of one or more EBLs to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap higher than that of the adjacent organic semiconductor from which excitons are being blocked. Preferably, the energy gap of the blocking layer is at least 2.3 kT higher than that of the adjacent layer in which excitons are being confined, and more preferably at least 4.6 kT higher. "k" is the Boltzmann constant, and T is temperature (about 300K for typical circumstances). For an energy level that is 4.6 kT higher, an electron will have about a 1% chance of climbing the energy barrier. Thus, the confined excitons are prohibited from existing in the EBL due to energy considerations. While it is desirable for the EBL to block excitons, it is not desirable for the EBL to block all charge. However, due to the nature of the adjacent energy levels, an EBL will necessarily block only one sign of charge carrier. By design, an EBL will always exist between two layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO level closely matching the LUMO level of the adjacent ETL material so that any undesired barrier to electrons is minimized.

It should be appreciated that the exciton blocking nature of a material is not an intrinsic property. Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the ETL and the cathode. A preferred material for the EBL comprises 2,9-dimethyl-4,7-diphenyl-1,10-phenanthroline (also called bathocuproine or BCP), which is believed to have a LUMO-HOMO separation of about 3.5 eV, or bis(2-methyl-8-hydroxyquinolinoato)-aluminum(III)phenolate ($Alq_2OPH$). BCP is an effective exciton blocker which can easily transport electrons to the cathode from the adjoining organic layer.

In another preferred embodiment of the invention, a EBL is situated between the anode and the HTL. A preferred material for this EBL comprises a film of 3,4-polyethylene dioxythiophene:polystyrenesulfonate (PEDOT:PSS). The introduction of the PEDOT:PSS layer between the anodes (ITO) and the HTL (CuPc) leads to fabrication yields of close to 100% (i.e., no shorts were observed for >50 measured devices of varying thickness). We attribute this to the ability of the spin-coated PEDOT:PSS film to planarize the ITO, whose rough surface could otherwise result in shorts through the thin molecular film. Additionally, other preferred embodiments of the invention may include two EBLs, one situated between the ETL and the cathode, and the other situated between the anode and the HTL.

The EBL layer maybe doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments may also comprise transparent charge transfer layers or charge recombination layers. As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticle or nanorods as described in U.S. Pat. No. 6,657,378, incorporated herein by reference in its entirety.

In another preferred embodiment of the invention, an anode-smoothing layer is situated between the anode and the donor layer. A preferred material for this layer comprises a film of 3,4-polyethylenedioxythiophene:polystyrenesulfonate (PEDOT:PSS). The introduction of the PEDOT:PSS layer between the anode (ITO) and the donor layer (CuPc) may lead to greatly improved fabrication yields. We attribute this to the ability of the spin-coated PEDOT:PSS film to planarize the ITO, whose rough surface could otherwise result in shorts through the thin molecular layers.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The high bulk resistivities of organic photoconductors make it desirable to utilize relatively thin films of these materials. However, thin photosensitive layers will absorb a smaller fraction of incident radiation, and thus the external quantum efficiency of thin-layer photoconductors may be lower than that of thick-layer photoconductors. The external quantum efficiency of thin-layer organic devices such as those described herein can be further enhanced, however, by a suitable design of the device geometry. Due to the thin photoactive layers of the embodiments described so far, device geometries which provide a means for increasing the effective thickness of the absorbant layers may be preferable. One such configuration is a stacked device as described in U.S. Pat. No. 6,198,091, incorporated herein by reference. As used herein, the terms "stack", "stacked", "multisection" and "multicell" refer to any optoelectronic device with multiple layers of a photoconductive material separated by one or more electrode or charge transfer layers. When the term "subcell" is used hereafter, it refers to an organic photosensitive optoelectronic construction. When a subcell is used individually as a photosensitive optoelectronic device, it typically includes a complete set of electrodes, i.e., positive and negative. As disclosed herein, in some stacked configurations it is possible for adjacent subcells to utilize common, i.e., shared, electrode or charge transfer layers. In other cases, adjacent subcells do not share common electrodes or charge transfer layers. Thus, a subcell may encompass the subunit construction regardless of whether each subunit has its own distinct electrodes or shares electrodes or charge transfer layers with adjacent subunits. Herein the terms "cell", "subcell", "unit", "subunit", "section", and "subsection" are used interchangeably to refer a photoconductive layer or set of layers and the adjoining electrodes or charge transfer layers.

Since the stacked subcells of the solar cell may be fabricated using vacuum deposition techniques that allow external electrical connections to be made to the electrodes separating the subcells, each of the subcells in the device may be electrically connected either in parallel or in series, depending on whether the power and/or voltage generated by the solar cell is to be maximized. The improved external quantum efficiency that may be achieved for stacked solar cell embodiments of the present invention may also be attributed to the fact that the subcells of the stacked solar cell may be electrically connected in parallel since a parallel electrical configuration permits substantially higher fill factors to be realized than when the subcells are connected in series.

Although the high series resistance of photoconductive organic materials inhibits use of subcells in a series configuration for high power applications, there are certain applications, for example, in operating liquid crystal displays (LCD), for which a higher voltage may be required, but only at low current and, thus, at low power levels. For this type of application, stacked, series-connected solar cells may be suitable for providing the required voltage to the LCD. In the case when the solar cell is comprised of subcells electrically connected in series so as to produce such a higher voltage device, the stacked solar cell may be fabricated so as to have each subcell producing approximately the same current so to reduce inefficiency. For example, if the incident radiation passes through in only one direction, the stacked subcells may have an increasing thickness with the outermost subcell, which is most directly exposed to the incident radiation, being the thinnest. Alternatively, if the subcells are superposed on a reflective surface, the thicknesses of the individual subcells may be adjusted to account for the total combined radiation admitted to each subcell from the original and reflected directions.

Further, it may be desirable to have a direct current power supply capable of producing a number of different voltages. For this application, external connections to intervening electrodes could have great utility. Accordingly, in addition to being capable of providing the maximum voltage that is generated across the entire set of subcells, an exemplary embodiment the stacked solar cells of the present invention may also be used to provide multiple voltages from a single power source by tapping a selected voltage from a selected subset of subcells.

The organic photosensitive optoelectronic devices of the present invention may function as photodetectors. In this embodiment, the device may be a multilayer organic device, for example as described in U.S. application Ser. No. 10/723,953, filed Nov. 26, 2003, incorporated herein by reference in its entirety. In this case an external electric field may be generally applied to facilitate extraction of the separated charges.

Coatings may be used to focus optical energy into desired regions of a device. U.S. patent application Ser. No. 10/857,747, which is incorporated by reference in its entirety, provides examples of such a coating.

A concentrator configuration can be employed to increase the efficiency of the device, where photons are forced to make multiple passes through the thin absorbing region. U.S. Pat. No. 6,333,458 entitled "Highly Efficient Multiple Reflection Photosensitive Optoelectronic Device with Optical Concentrator" ("'458 patent"), incorporated herein by reference, addresses this issue by using structural designs that enhance the photoconversion efficiency of photosensitive optoelectonic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the thin film of photoconductive material. The geometries disclosed in the '458 patent therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

The '458 patent also discloses an aperture in either one of the reflecting surfaces or an external side face of the waveguiding device for coupling to an optical concentrator, such as a Winston collector, to increase the amount of electromagnetic radiation efficiently collected and delivered to the cavity containing the photoconductive material. Exemplary non-imaging concentrators include a conical concentrator, such as a truncated paraboloid, and a trough-shaped concentrator. With respect to the conical shape, the device collects radiation entering the circular entrance opening of diameter $d_1$ within $\pm\theta_{max}$ (the half angle of acceptance) and directs the radiation to the smaller exit opening of diameter $d_2$ with negligible losses and can approach the so-called thermodynamic limit. This limit is the maximum permissible concentration for a given angular field of view. Conical concentrators provide higher concentration ratios than trough-shaped concentrators but require diurnal solar tracking due to the smaller acceptance angle. (*After High Collection Nonimaging Optics* by W. T. Welford and R. Winston, (hereinafter "Welford and Winston") pp 172-175, Academic Press, 1989, incorporated herein by reference).

Several guidelines should be kept in mind in designing an efficient organic photosensitive optoelectronic device. It is desirable for the exciton diffusion length, $L_D$, to be greater than or comparable to the layer thickness, L, as it is believed that most exciton dissociation will occur at an interface. If $L_D$ is less than L, then many excitons may recombine before dissociation. It is further desirable for the total photoconductive material thickness to be of the order of the electromagnetic radiation absorption length, $1/\alpha$ (where $\alpha$ is the absorption coefficient), so that nearly all of the radiation incident on the solar cell is absorbed to produce excitons. However, the thickness should not be so large compared to the extent of the heterojunction electric fields that many excitons are generated in a field-free region. As the electric field helps to dissociate the excitons, if an exciton dissociates in a field-free region, it is more likely to suffer geminant recombination and contribute nothing to the photocurrent. Further, electric fields may exist at the electrode/semiconductor interfaces. These fields at the electrode interfaces can also promote exciton quenching. Furthermore, the photoconductive layer should be as thin as possible to avoid excess series resistance due to the high bulk resistivity of organic semiconductors.

On the other hand, another countervailing consideration is that as the separation between the exciton dissociating interface and the adjacent electrodes increases, the electric field region around the interface will have a higher value over a greater volume. As light absorption increases with increasing electric field strength, more excitons will be generated. Also, the higher electric fields will also promote faster exciton dissociation.

A $CuPc/C_{60}$ material system has been shown to yield solar cells with $\eta_P$=3.6% and is an obvious candidate for further improvement using the method presented herein. In agreement with the findings reported in "Organic Co-evaporated films of a PPV-pentamer and $C_{60}$: model systems for donor/acceptor polymer blends" by Geens, W. et al., *Thin Solid*

*Films* 403-404, 438-443 (2002), and "The effect of fullerene doping on photoelectric conversion using titanyl phthalocyanine and a perylene pigment" by Tsuzuki, T. et al., *Sol. Energy Mater. Sol Cells* 61, 1-8 (2000), we find that as-grown mixed layers devices that incorporate $C_{60}$ exhibit conversion efficiencies approaching, but not exceeding those of optimized bilayer systems. This is attributed to substantial phase segregation during growth due to the pure aromatic nature and highly symmetrical shape of $C_{60}$ which increases the driving force for phase segregation.

Devices have been constructed and example data recorded for exemplary embodiments of the present invention. The following examples of the invention are illustrative and not limiting of the invention.

EXAMPLES

Example 1

The PV cells were deposited on glass substrates pre-coated with a 1500 Å thick, transparent, conducting indium-tin-oxide (ITO) anode (sheet resistance 40Ω/□). The substrates were cleaned immediately prior to transferring them into the vacuum system for film deposition. The organic materials were commercially obtained and purified prior to deposition using thermal gradient sublimation. The photoactive materials used were copper phthalocyanine (CuPc) and 3,4,9,10-perylenetetracarboxylic bis-benzimidazole (PTCBI), and bathocuproine (BCP) was used as a contact buffer layer. The organic layers were grown by high vacuum thermal evaporation (base pressure $10^{-7}$-$10^{-6}$ Torr) from a tungsten boat onto a room-temperature substrate. This was followed by the deposition of the metal cathode through a shadow mask, resulting in contact diameters of 0.3 mm and 1 mm.

After fabrication, the cells were transferred to a vacuum chamber held at 30 m Torr with a heating stage, electrical probes and windows for optical access. The temperature ramp rate of the heating stage was fixed at 15° C./min. Electrical characterization was performed during annealing using a semiconductor parameter analyzer to obtain the current-voltage (I-V) characteristics. For in-situ photovoltaic power efficiency measurements, the devices were illuminated through the substrate with a 1000 W Oriel solar simulator equipped with an AM 1.0 filter. To measure the external quantum efficiency, a monochromatic beam of variable wavelength light chopped at 400 Hz (50% duty cycle) was focused onto a 1 mm diameter device. The photocurrent was measured using a lock-in amplifier referenced to the chopper frequency.

Scanning electron microscope (SEM) images of the film surfaces in FIG. 1*d-e* show the effect of capping by a 1000 Å thick Ag film during annealing. The layer structure was ITO/100 Å CuPc/600 Å CuPc:PTCBI (3:4)/100 Å PTCBI. The concentration of CuPc to PTCBI in this case was 3:4, by weight, achieved through codeposition. The images show the organic surface morphology after annealing for 2 min at 560K.

In FIGS. 1*d* and *e*, the film was not capped by metal during the annealing process, resulting in a high density of pinholes (~8×10⁸ cm⁻²) and of large crystallites protruding from the film surface. In FIG. 1*f*, the organic layers were covered with a 1000 Å-thick Ag cap during annealing. The cap was peeled off using sticky tape prior to imaging. The resulting organic film is pinhole-free and lacks large (~1 μm) crystalline domains, suggesting that the metal layer prevents morphological changes from occurring in the underlying film. For comparison, the surface morphology of a conventional non-annealed bilayer structure: ITO/400 Å CuPc/400 Å PTCBI/ 1000 Å Ag after removing the Ag cap is shown in FIG. 1*g*. The features in this image correspond to crystalline domains of pure, planar-stacking PTCBI.

Example 2

FIG. 2 contains SEM images of cross-sections of the layer structure: ITO/5000 Å CuPc:PTCBI (4:1)/1000 Å Ag are shown for (a) an as-grown film, and for films annealed for 15 min at (b) $T_{A1}$=450K, (c) $T_{A1}$=500K, and (d) $T_{A1}$=550K. The images show phase segregated domains, alternatively rich in CuPc and PTCBI, the cross-sections revealing domains whose size increases with increasing annealing temperature. At 550K, domain sizes of 20 nm are observed.

Example 3

Figure 3:
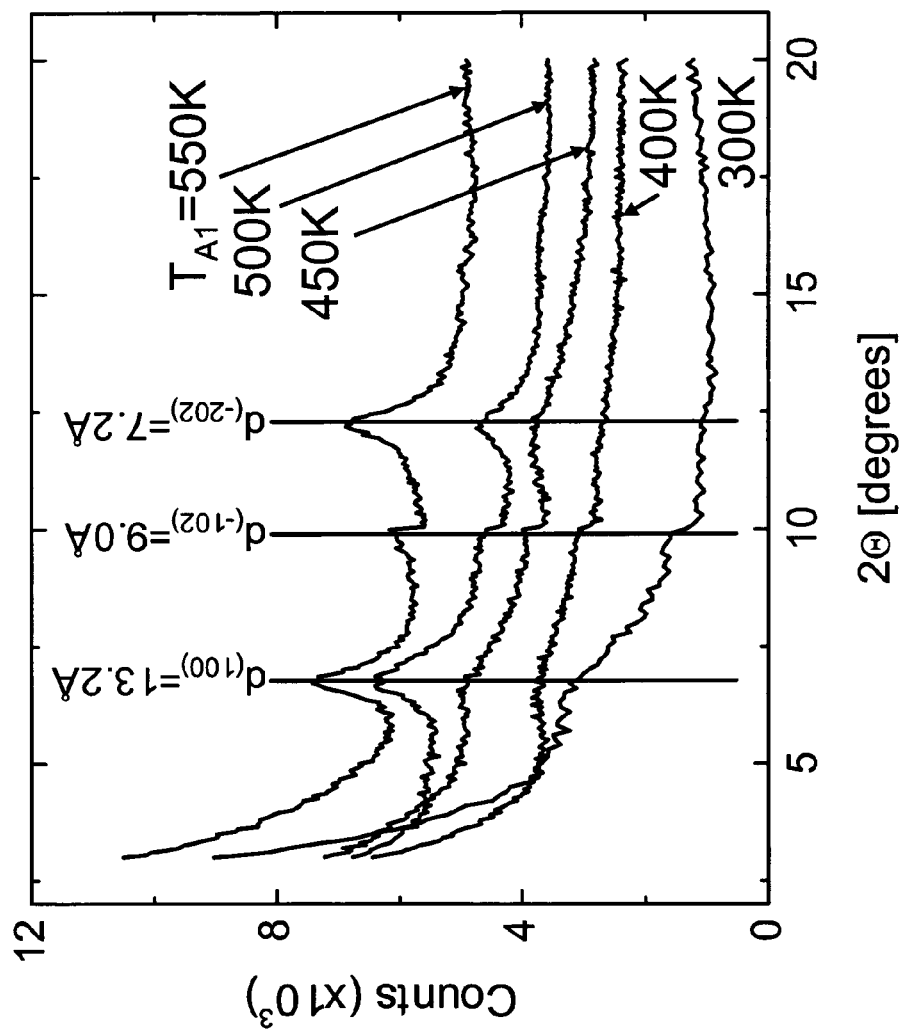
FIG. 3 shows Bragg-Brentano X-Ray diffractograms of a 5000 Å-thick film on ITO using the Cu-Kα line. The film was covered with a 1000 Å-thick cap of Ag and annealed at 300K (not annealed), and $T_{A1}=400K$, 450K, 500K, and 550K. The Ag cap was removed prior to performing the scan. CuPc crystal indices are noted. The amorphous background is indicated by the broad curvature at low X-Ray angles.

Domain sizes of 20 nm are confirmed by the X-Ray diffraction data shown in FIG. 3. Upon annealing, diffraction peaks corresponding to the orthorhombic α-CuPc phase emerge, and the broad amorphous background signal between 2Θ=2.5° and 12.5° is reduced. The large width of the peaks suggests limited crystalline domain size. For the film annealed at 550K, using the FWHM (full width half maximum) of the peaks at 2Θ=6.7° and 2Θ=12.2°, we calculate a domain size of (12±1) nm, which is consistent with the observations in FIG. 2. This represents a lower limit to the domain size, as the diffraction peaks are also broadened by molecular disorder and large strains associated with the growth of domains within an amorphous matrix. Additional potential contribution to the peak width is residual "doping" of the CuPc and PTCBI-rich phases with PTCBI and CuPc, respectively.

Example 4

To gain a better understanding of the underlying physical process of phase separation on the performance of mixed-layer PV cells, a microscopic model is required. We have implemented such a model using cellular automata since this approach provides a numerically efficient and at the same time phenomenologically sound method of discretely simulating recrystallization and grain growth. Briefly, a volume is discretized into a three-dimensional array in a simple cubic lattice containing Nx×Ny×Nz=N cells. We define the z-direction as the growth direction (i.e. perpendicular to the substrate plane). Periodic boundary conditions are applied in the x and y-directions. The free energy of a configuration is:

$$E = \frac{1}{2}\sum_{i=1}^{N}\sum_{j=1}^{6} E_{M(i),M(j)}$$

where j sums over all nearest neighbors, M(i) is the material at location i, and $E_{A,B}$ is the free energy associated with the molecular contact between molecules A and B. In this scheme, the cohesive energy per mole of material A is $E_{coh}$=3 $N_A E_{A,A}$, where $N_A$ is Avogadro's constant. $E_{coh}$ is also the evaporation enthalpy, $\Delta H^{vap}$, which can be obtained by thermogravimetry. In our simulations, only two materials CuPc ($\Delta H^{vap}$ (CuPc)=176 kJ/mole) and PTCBI are used. Since $\Delta H^{vap}$ (PTCBI) is unknown, and since most small molecular organic materials used in organic electronic devices have similar $\Delta H^{vap}$ values, we assume that $E_{PTCBI}$=$E_{CuPc}$. Furthermore, we assume 2 $E_{CuPc,PTCBI}$=$E_{CuPc,CuPc}$=$E_{PTCBI,PTCBI}$.

The lattice is initialized to mimic the as-grown mixed structures. Subsequently, phase segregation is modeled using a single transformation rule: two neighboring molecules can exchange positions. Assuming that $R_0$ is the rate at which molecular exchanges are attempted per cell, the rate of attempts able to overcome the energy barrier, $\Delta E_A$, of exchanging two molecules is a function of temperature: $R(T)=R_0 \exp(-\Delta E_A/kT)$, where k is Boltzmann's constant and T is the absolute temperature. The activation energy associated with the switching of two molecules is prohibitively high since it would require the molecules to deform significantly. The actual process thus involves the presence of a vacancies whose activation energy is that responsible for the generation of those vacancies.

In FIG. 2e-h, the effect of the annealing temperature $T_{A1}$ on the interface morphology of a mixed layer device, is shown. The initial configuration (FIG. 2e) generated using a random number generator, assumes a mixture composition of 1:1. This assumes that no significant phase segregation occurs during deposition. Annealing at (f) $T_{A1}=0.067\ E_{coh}/k$, (g) $T_{A1}=0.13\ E_{coh}/k$ and (h) $T_{A1}=0.20\ E_{coh}/k$ has a dramatic influence on the morphology of the mixed layer device, and they bear a remarkable resemblance to the observed cross-sections in FIG. 2a-d. Phase separation leads to the appearance of branches of pure material that grow increasingly thicker with increasing $T_{A1}$. The exciton diffusion efficiency, $\eta_{ED}$, is reduced in the thicker branches, but their presence improves the charge collection efficiency, $\eta_{CC}$.

Example 5

Figure 4:
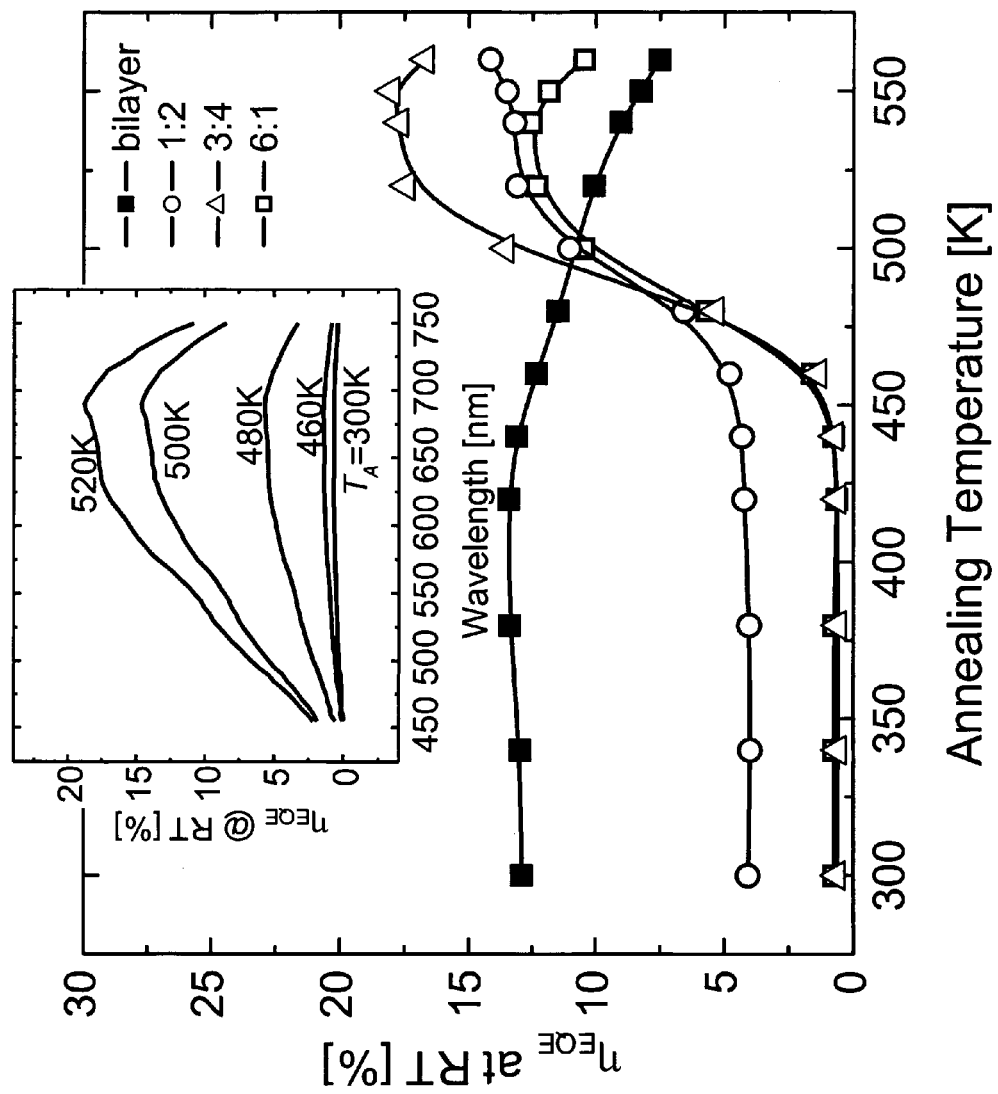
FIG. 4 shows room temperature external quantum efficiency ($\eta_{EQE}$) after annealing at various temperatures of a bilayer device with layer structure: ITO/400 Å CuPc/400 Å PTCBI/1000 Å Ag, and of mixed-layer devices with layer structures: ITO/100 Å CuPc/600 Å CuPc:PTCBI (x:y)/100 Å PTCBI/1000 Å Ag, where x:y is 1:2, 3:4 and 6:1. The cells were subsequently annealed for 2 min at 340K and 380K, then every 20K between 420K and 540K, and 550K and 560K, each time returning to room temperature between annealing steps to measure $\eta_{EQE}$. Inset: Room temperature $\eta_{EQE}$ after annealing at various temperatures of a device with layer structure: ITO/100 Å CuPc/600 Å CuPc:PTCBI (3:4)/100 Å PTCBI/1000 Å Ag. The cell was annealed and measured as in FIG. 4.

By measuring the room-temperature external quantum efficiency, $\eta_{EQE} \propto \eta_{ED} \cdot \eta_{CC}$ as
a function of the annealing temperature, $T_{A1}$, the effect of this morphological change on exciton and charge transport can be inferred. In the inset of FIG. 4, the action spectrum of a device with layer structure ITO/100 Å CuPc/600 Å CuPc:PTCBI (3:4)/100 Å PTCBI 1000 Å Ag is shown as a function of $T_{A1}$. A 30-fold increase in $\eta_{EQE}$ is observed at a wavelength of $\lambda=690$ nm, from 0.6% to 19%. The increase is uniform over the entire absorption spectrum of both CuPc and PTCBI, and cannot be identified with only a single component. This confirms that the increase in $\eta_{EQE}$ is not a consequence of a change in the properties of one material, but is indeed associated with a change in morphology of the entire mixed layer.

Example 5a

In FIG. 4, $\eta_{EQE}$ at $\lambda=632$ nm is shown for a bilayer device with structure ITO/400 Å CuPc/400 Å PTCBI/1000 Å Ag (closed squares), and for mixed-layer devices with layer structures ITO/100 Å CuPc/600 Å CuPc:PTCBI (x:y)/100 Å PTCBI/1000 Å Ag, where x:y is 1:2 (open circles), 3:4 (open triangles), and 6:1 (open squares). For these measurements, the devices were subsequently annealed for 2 min at 340K and 380K, then every 20K between 420K and 540K, and finally at 550K, and 560K, each time returning to room temperature between annealing steps to measure $\eta_{EQE}$. Annealing a bilayer device does not significantly improve $\eta_{EQE}$, and annealing at $T_{A1}>450$K even results in its decrease. In contrast, for all mixed layer devices, a significant increase in $\eta_{EQE}$ is observed upon annealing at $T_{A1}>450$K, with an optimal annealing temperature of $T_{A1}=540$K. While the maximum attainable $\eta_{EQE}$ clearly depends on the composition of the mixed layer, the $\eta_{EQE}$ vs. annealing temperature characteristics have a similar shape, independent of the mixture composition.

Example 6

Table 1 lists the room-temperature performance characteristics of a mixed layer device with structure: ITO/100 Å CuPc/600 Å CuPc:PTCBI (6:1)/100 Å PTCBI/1000 Å Ag as a function of the annealing treatment. For reference, the performance parameters of a bilayer device are also shown. The cells were illuminated with a tungsten-halogen lamp with a power density of 7.8 mW/cm². Prior to annealing, the short-circuit current density ($J^M_{SC}=15.5\ \mu A/cm^2$) of the mixed layer device is more than an order of magnitude smaller than that of the bilayer ($J^B_{SC}=340\ \mu A/cm^2$), leading to a low power conversion efficiency of $\eta_P=(1.3\pm0.1)\times10^{-2}$. After annealing at $T_{A1}=520$K, $J^M_{SC}=190\ \mu A/cm^2$. This is in contrast to the results for $\eta_{EQE}$ of a device with an identical layer structure (FIG. 4), where $\eta_{EQE}$ of the annealed mixed layer device approaches that of the as-grown bilayer device. Without being bound by theory, this apparent contradiction is believed to be a consequence of the higher optical power levels used during measurements of the I-V characteristics as compared to the $\eta_{EQE}$ measurements. The drop in $V_{OC}$ from 0.26V to 0.10V partially offsets the gains in $J_{SC}$, leading to $\eta_P=(6.5\pm0.4)\times10^{-1}$%.

Without being bound by theory, the drop in $V_{OC}$ is believed to be due to an increased resistance arising from a reduction in disorder at the organic/Ag interface due to the annealing process. Hence, improvements in performance may be achieved by replacing the contact by peeling off the "confining" Ag layer and replacing it by deposition of a 120 Å BCP/1000 Å Ag contact. This contact replacement results in an increased $J^M_{SC}=250\ \mu A/cm^2$ and $V_{OC}=0.30$V (see Table 1). Annealing this device a second time at $T_{A2}=500$K once more improves the characteristics, resulting in $J^M_{SC}=880\ \mu A/cm^2$. The open circuit voltage of $V^M_{OC}=0.44$V also exceeds that of the bilayer device ($V^B_{OC}=0.33$V). The power conversion efficiency of the twice-annealed mixed-layer device with a replaced contact is '$\eta_P=(1.5\pm0.1)$%. This is a two-fold improvement over the bilayer of identical total thickness with $\eta_P=(0.75\pm0.1)$ %.

TABLE 1

Effect of various treatments on the room-temperature performance characteristics of a ITO/400 Å CuPc/400 Å PTCBI/1000 Å Ag bilayer and ITO/100 Å CuPc/600 Å CuPc:PTCBI (6:1)/100 Å PTCBI/1000 Å Ag mixed layer solar cell.

| | $J_{SC}$ (μA/cm²) | $V_{OC}$ (V) | FF | $\eta_P$ (%) |
|---|---|---|---|---|
| As-grown bilayer | 340 | 0.33 | 0.52 | 0.75 ± 0.05 |
| As-grown mixed layer | 15.5 | 0.26 | 0.25 | (1.3 ± 0.1) × 10⁻² |
| 1st anneal ($T_{A1}$ = 520K) | 190 | 0.10 | 0.27 | (6.5 ± 0.4) × 10⁻¹ |
| Contact replacement | 250 | 0.30 | 0.26 | 0.25 ± 0.2 |
| 2nd anneal ($T_{A2}$ = 500K) | 880 | 0.44 | 0.31 | 1.5 ± 0.1 |

Note:
Illumination source: Tungsten-Halogen lamp with a power density of 7.8 mW/cm². Here, $J_{SC}$ is the short-circuit current density, $V_{OC}$ is the open-circuit voltage, FF is the fill-factor, and $\eta_P$ is the power conversion efficiency.

Example 7

Figure 5:
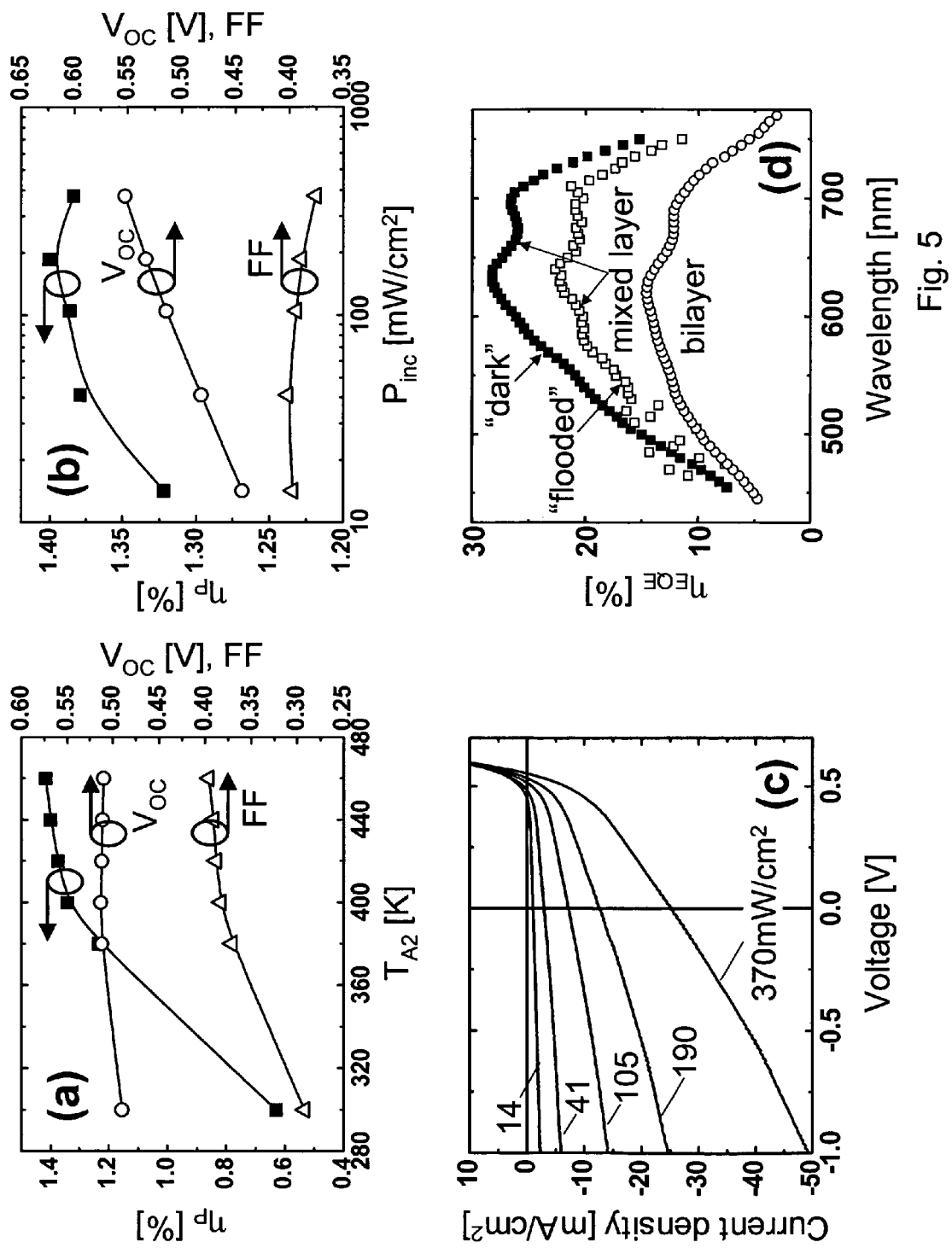

The contact replacement strategy, described in Example 6, was used to fabricate a solar cell with a high power conversion efficiency under standard AM1 illumination conditions at an intensity of 105 mW/cm² (i.e. ~1 sun). The device layer structure: ITO/150 Å CuPc/440 Å CuPc:PTCBI (1:1)/100 Å PTCBI/1000 Å Ag was first annealed at $T_{A1}$=520K for 2 min. The contact was subsequently peeled off and replaced by deposition of a 150 Å BCP/1000 Å Ag contact. The solar cell performance characteristics after the second anneal are shown in FIG. 5a as a function of $T_{A2}$. A maximum efficiency was reached for $T_{A2}$=460K, with $\eta_P$=(1.42±0.07)% representing the highest efficiency (by ~50%) achieved for CuPc/PTCBI PV "Tang" cells over the last 16 years. Since the second annealing process is essentially complete at $T_{A2}$=400K, the mechanism leading to cell improvement is believed to be different from that of the first annealing step. Without being bound by theory, it is believed that a role of the second annealing process is to remove contaminants such as $H_2O$ or $O_2$ from the DA interfaces, which provide sites for exciton and/or charge recombination. A similar increase in $\eta_P$ was observed when a sample that was exposed to air after the first anneal was annealed a second time. Air exposure caused a rapid decrease in $\eta_P$, reducing it to less than 50% of the pre-exposure value. Here, the pre-exposure $\eta_P$ is recovered after annealing to 400K. It is possible that some "forming" of the DA mixed layer/BCP contact also occurs during the second thermal treatment.

The dependence of the performance characteristics of this device on the incident optical power, is shown in FIG. 5b. The photocurrent has a linear dependence on the illumination intensity as shown in FIG. 5c, and the increase in $V_{OC}$ with increased illumination intensity offsets the decrease in fill factor (FF), resulting in $\eta_P$ being nearly independent of the illumination intensity. In FIG. 5c, the current-voltage characteristics are also shown as a function of intensity. At –1V bias, the photocurrent density was approximately twice that obtained under short-circuit conditions. Without being bound by theory, it is believed that the strong dependence of photocurrent on applied bias suggests that carrier collection ultimately limits $\eta_P$. Optimization of the carrier collection efficiency may, therefore, lead to improvements in $J_{SC}$, and hence $\eta_P$.

The external quantum efficiency, $\eta_{EQE}$, is shown in FIG. 5d, measured with (open squares) and without (filled squares) flooding by 105 mW/cm² AM1 white light illumination. For comparison, the $\eta_{EQE}$ of an optimized bilayer device: ITO/200 Å CuPc/200 Å PTCBI/150 Å BCP/Ag is also shown (open circles). The peak "dark" $\eta^M_{EQE}$=28% of the annealed mixed layer device is twice that of the bilayer device $\eta^B_{EQE}$ 14%. The decrease in $\eta_{EQE}$ upon flooding with white light is a consequence of the increased carrier concentration under illumination which increases the recombination probability, and hinders charge transport because of space-charge build-up within the complex folds of the bulk heterojunction structure.

In summary, we have demonstrated the fabrication of bulk heterojunction PV cells using vacuum-deposited small molecular weight organic materials. The process relies on the annealing of mixed-layer films in a confined geometry, i.e. with a contact that prevents stress relief during morphological relaxation that typically occurs in molecular materials at elevated temperatures. The process was analyzed using scanning electron microscopy, X-Ray diffraction and microscopic phase segregation simulations. Measurements on mixed-layer devices after annealing show dramatic increases in their external quantum efficiencies. To address potential degradation of the contact properties upon annealing, the confining layer cap may be removed and replaced, for example, with a BCP/Ag contact. Annealing the device a second time results in power conversion efficiencies significantly exceeding those of bilayer devices.

Thus, there has been described and illustrated herein an organic photosensitive optoelectronic device and method for producing the same. Those skilled in the art, however, will recognize that many modifications and variations besides those specifically mentioned may be made in the apparatus and techniques described herein without departing substantially from the concept of the present invention. Accordingly, it should be clearly understood that the form of the present invention as described herein is exemplary only and is not intended as a limitation on the scope of the present invention.

What is claimed is:

1. A method for making an organic photosensitive optoelectronic device comprising the steps of:
    (a) depositing a first organic layer over a first electrode;
    (b) depositing a second organic layer over the first organic layer;
    (c) depositing a confining layer over the second organic layer to form a stack;
    (d) annealing the stack; and
    (e) depositing a second electrode over the second organic layer, wherein the device is capable of generating a voltage when exposed to light, wherein said confining layer prevents formation of a rough surface morphology while allowing formation of a bulk heterojunction with an interpenetrating donor-acceptor network between the first and second organic layers during said annealing step.

2. The method of claim 1, wherein the first organic layer is a donor layer.

3. The method of claim 1, wherein the second organic layer is an acceptor layer.

4. The method of claim 1, wherein the annealing is carried out by irradiation with light having a wavelength of from about 400 nm to about 700 nm.

5. The method of claim 1, further comprising depositing a third organic layer over the second organic layer.

6. The method of claim 4, wherein the third organic layer is an exciton blocking layer.

7. The method of claim 1, wherein the device further comprises at least one crystalline domain in the organic layers after the annealing step.

8. The method of claim 7, wherein the crystalline domain is from about 0.5 nm to about 100 nm.

9. The method of claim 7, further comprising depositing a third organic layer over the second organic layer.

10. The method of claim 1, wherein the annealing is carried out at a temperature of from about 340K to about 600K.

11. The method of claim 10, wherein the annealing is carried out at a temperature of about 560K.

12. The method of claim 10, wherein the annealing is carried out at a pressure less than about 10 mTorr.

13. The method of claim 12, wherein the annealing is carried out in a vacuum or inert gas atmosphere.

14. The method of claim 1, wherein the annealing is carried out for a time of from about 5 seconds to about 30 minutes.

15. The method of claim 14, wherein the annealing is carried out for a time of about 15 minutes.

16. The method of claim 14, wherein the annealing is carried out for a time of about 2 minutes.

17. A method for making an organic photosensitive optoelectronic device comprising the steps of:
    (a) depositing a first organic layer over a first electrode;
    (b) depositing a second organic layer over the first organic layer;
    (c) depositing a confining layer over the second organic layer to form a stack;

(d) annealing the stack;
(e) removing the confining layer; and
(f) depositing a second electrode over the second organic layer, wherein the device is capable of generating a voltage when exposed to light.

18. The method of claim 17, further comprising:
depositing an exciton blocking layer over the second organic layer after removing the confining layer; and
annealing the stack after depositing the second electrode.

19. The method of claim 17, wherein the device farther comprises at least one crystalline domain in the organic layers after the annealing step.

20. The method of claim 19, further comprising:
depositing an exciton blocking layer over the second organic layer after removing the confining layer; and
annealing the stack after depositing the second electrode.

* * * * *

UNITED STATES PATENT AND TRADEMARK OFFICE
CERTIFICATE OF CORRECTION

| | |
|---|---|
| PATENT NO. | : 7,597,927 B2 |
| APPLICATION NO. | : 10/876951 |
| DATED | : October 6, 2009 |
| INVENTOR(S) | : Peter Peumans, Soichi Uchida and Stephen R. Forrest |

It is certified that error appears in the above-identified patent and that said Letters Patent is hereby corrected as shown below:

Column 1, beginning on line 3 directly below the title and above the section heading "Field of Invention", please insert the following paragraph:

--GOVERNMENT RIGHTS

This invention was made with government support under Grant #ACQ-1-30619-05 (Prime DE-AC36-99GO10337) awarded by the National Renewable Energy Laboratory of the U.S. Department of Energy. The government has certain rights in the invention.--

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,597,927 B2 Page 1 of 1
APPLICATION NO. : 10/876951
DATED : October 6, 2009
INVENTOR(S) : Peumans et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1370 days.

Signed and Sealed this

Twenty-eighth Day of September, 2010

David J. Kappos
*Director of the United States Patent and Trademark Office*